United States Patent
Jang

(10) Patent No.: US 10,644,081 B2
(45) Date of Patent: *May 5, 2020

(54) FLEXIBLE DISPLAY APPARATUS AND METHOD OF FABRICATING THE SAME

(71) Applicant: SAMSUNG DISPLAY CO., LTD., Yongin-si, Gyeonggi-do (KR)

(72) Inventor: Yong-Kyu Jang, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/644,010

(22) Filed: Jul. 7, 2017

(65) Prior Publication Data

US 2017/0309690 A1   Oct. 26, 2017

Related U.S. Application Data

(63) Continuation of application No. 15/174,776, filed on Jun. 6, 2016, now Pat. No. 9,825,105, which is a (Continued)

(30) Foreign Application Priority Data

Jul. 19, 2012  (KR) .................... 10-2012-0078959

(51) Int. Cl.
  *H01L 27/32* (2006.01)
  *H01L 51/52* (2006.01)
  *H01L 51/00* (2006.01)
  *H01L 51/56* (2006.01)

(52) U.S. Cl.
  CPC ...... *H01L 27/3244* (2013.01); *H01L 51/0097* (2013.01); *H01L 51/524* (2013.01);
  (Continued)

(58) Field of Classification Search
  CPC ............. H01L 27/3244; H01L 51/5281; H01L 51/0097; H01L 51/56; H01L 51/5256;
  (Continued)

(56) References Cited

U.S. PATENT DOCUMENTS

2004/0182816 A1    9/2004  Chung et al.
2005/0104516 A1*   5/2005  Park ................. C03C 15/00
                                                313/512
(Continued)

FOREIGN PATENT DOCUMENTS

JP    2009-190186 A    8/2009
KR    10-2010-0063292  6/2010
(Continued)

*Primary Examiner* — Niki H Nguyen
*Assistant Examiner* — Juanita Rhodes
(74) *Attorney, Agent, or Firm* — Lewis Roca Rothgerber Christie LLP

(57) ABSTRACT

A method of forming a flexible display apparatus includes: forming a flexible substrate on a support substrate; forming a light-emitting diode on the flexible substrate; forming a first encapsulation layer on the light-emitting diode; forming a second encapsulation layer; bonding the first encapsulation layer to the second encapsulation layer using an adhesive layer between the first encapsulation layer and the second encapsulation layer; separating the support substrate from the flexible substrate and cutting the flexible substrate to form the flexible display apparatus; and forming a polarizing plate on the second encapsulation layer.

10 Claims, 12 Drawing Sheets

Related U.S. Application Data continuation of application No. 13/664,375, filed on Oct. 30, 2012, now Pat. No. 9,385,331.

(52) U.S. Cl.
CPC ...... *H01L 51/5256* (2013.01); *H01L 51/5281* (2013.01); *H01L 51/56* (2013.01); *H01L 51/5293* (2013.01); *H01L 2227/326* (2013.01); *H01L 2251/5338* (2013.01); *Y02E 10/549* (2013.01); *Y02P 70/521* (2015.11)

(58) Field of Classification Search
CPC ........... H01L 51/524; H01L 2251/5338; H01L 2227/326; H01L 51/5293; Y02E 10/549; Y02P 70/521
See application file for complete search history.

(56) References Cited

U.S. PATENT DOCUMENTS

| | | |
|---|---|---|
| 2005/0271873 A1 | 12/2005 | Kameyama et al. |
| 2008/0303408 A1 | 12/2008 | Yamazaki et al. |
| 2010/0033087 A1* | 2/2010 | Kim .................... H01L 51/5281 313/504 |
| 2010/0035503 A1 | 2/2010 | Kim et al. |
| 2010/0101856 A1* | 4/2010 | Yee ..................... H01L 51/5237 174/544 |
| 2010/0308335 A1 | 12/2010 | Kim et al. |
| 2011/0134018 A1* | 6/2011 | Seo ........................ H01L 51/003 345/76 |
| 2011/0147721 A1* | 6/2011 | Han ..................... G02B 5/3033 257/40 |
| 2011/0234088 A1* | 9/2011 | Abe ..................... G02B 5/0215 313/504 |
| 2012/0098026 A1 | 4/2012 | Kwack et al. |
| 2012/0100647 A1 | 4/2012 | Kim et al. |
| 2013/0001610 A1* | 1/2013 | Iwakura ............... H01L 27/3223 257/91 |
| 2013/0168644 A1 | 7/2013 | Park |

FOREIGN PATENT DOCUMENTS

| | | |
|---|---|---|
| KR | 10-2010-0130898 | 12/2010 |
| KR | 10-1065318 | 9/2011 |

\* cited by examiner

FLEXIBLE DISPLAY APPARATUS AND METHOD OF FABRICATING THE SAME

CROSS-REFERENCE TO RELATED PATENT APPLICATION

This application is a continuation of U.S. patent application Ser. No. 15/174,776, filed Jun. 6, 2016, which is a continuation of U.S. Pat. No. 9,385,331, filed Oct. 30, 2012, which claims priority to and the benefit of Korean Patent Application No. 10-2012-0078959, filed Jul. 19, 2012, the entire content of each of which is incorporated herein by reference.

BACKGROUND

1. Field

Embodiments of the present invention relate to a flexible display apparatus and a method of fabricating the same.

2. Description of the Related Art

Liquid crystal display devices and organic light-emitting display devices which include thin film transistors (TFTs) are widely used in digital cameras, video cameras, or mobile devices such as portable personal digital assistants (PDAs) and cellular phones.

Such display devices used in mobile devices are required to be thin, light, and break-resistant. A thin glass substrate may be used to form a thin and light display device. In addition, a display device may be prepared using a conventional glass substrate, and then the glass substrate may be thinned by a mechanical or chemical method. However, these processes are complicated and difficult to use.

Furthermore, there is a need for a flexible display device that may be applied to a curved surface so that the mobile devices may have high portability and various shapes. However, conventional glass substrates are not flexible.

In order to overcome this problem, attempts have been made to form a low-temperature polycrystalline silicon thin film transistor on a plastic substrate. A plastic substrate having a thickness of about 0.2 mm does not easily break, and has a lower specific gravity than a glass substrate. In addition, the weight of the plastic substrate may be ⅕ or less of that of the glass substrate and the plastic substrate may be applied to a curved surface.

SUMMARY

Aspects of embodiments of the present invention are directed to a thin film encapsulation method for efficiently controlling internal outgassing and blocking infiltration of external moisture in a cost-effective manner.

According to an embodiment of the present invention, a method of fabricating a flexible display apparatus includes: forming a flexible substrate on a support substrate; forming a light-emitting diode on the flexible substrate; forming a first encapsulation layer on the light-emitting diode; forming a second encapsulation layer; bonding the first encapsulation layer to the second encapsulation layer using an adhesive layer between the first encapsulation layer and the second encapsulation layer; separating the support substrate from the flexible substrate and cutting the flexible substrate to form the flexible display apparatus; and forming a polarizing plate on the second encapsulation layer.

The forming of the first encapsulation layer may include forming an organic-inorganic complex layer on the light-emitting diode.

The forming of the second encapsulation layer may include: forming an organic-inorganic complex layer on one surface of a base film; and forming an adhesive layer on the organic-inorganic complex layer. The base film may be a quarter wave plate, and the organic-inorganic complex layer may include at least one inorganic layer.

According to another embodiment of the present invention, a method of fabricating a flexible display apparatus includes: forming a flexible substrate on a support substrate; forming a light-emitting diode on the flexible substrate; forming a first encapsulation layer on the light-emitting diode; forming a second encapsulation layer; forming a polarizing plate on the second encapsulation layer; bonding the first encapsulation layer to the second encapsulation layer using an adhesive layer between the first encapsulation layer and the second encapsulation layer; and separating the support substrate from the flexible substrate and cutting the flexible substrate to form the flexible display apparatus.

The forming of the first encapsulation layer may include forming an organic-inorganic complex layer on the light-emitting diode.

The forming of the second encapsulation layer may include: forming an organic-inorganic complex layer on one surface of a base film; and forming an adhesive layer on the organic-inorganic complex layer. The base film may be a quarter wave plate. The organic-inorganic complex layer may include at least one inorganic layer.

According to another embodiment of the present invention, a method of fabricating a flexible display apparatus includes: forming a flexible substrate on a support substrate; forming a light-emitting diode on the flexible substrate; forming an encapsulation layer; bonding the encapsulation layer to the light-emitting diode using an adhesive layer between the encapsulation layer and the light-emitting diode to seal the light-emitting diode; separating the support substrate from the flexible substrate and cutting the flexible substrate to form the flexible display apparatus; and forming a polarizing plate on the encapsulation layer.

The forming of the encapsulation layer may include: forming an organic-inorganic complex layer on one surface of a base film; and forming an adhesive layer on the organic-inorganic complex layer. The base film may be a quarter wave plate. The organic-inorganic complex layer may include at least one inorganic layer.

According to another embodiment of the present invention, a flexible display apparatus includes: a flexible substrate; a light-emitting diode on the flexible substrate; a first encapsulation layer on the light-emitting diode; an adhesive layer on the first encapsulation layer; a second encapsulation layer on the first encapsulation layer; and a polarizing plate on the second encapsulation layer.

The first encapsulation layer may be an organic-inorganic complex layer. The second encapsulation layer may be an organic-inorganic complex layer that includes a quarter wave plate and at least one inorganic layer on the quarter wave plate.

According to another embodiment of the present invention, a flexible display apparatus includes: a flexible substrate; a light-emitting diode on the flexible substrate; an encapsulation layer on the light-emitting diode; an adhesive layer between the light-emitting diode and the encapsulation layer; and a polarizing plate on the encapsulation layer.

The encapsulation layer may be an organic-inorganic complex layer that includes a quarter wave plate and at least one inorganic layer on the quarter wave plate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
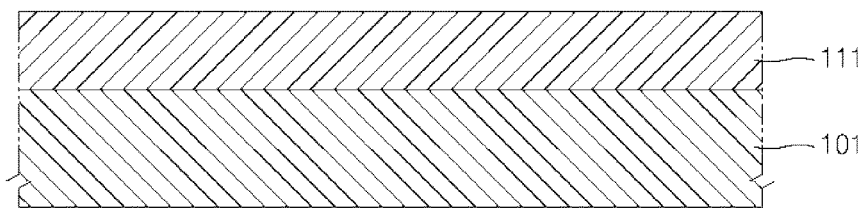
FIGS. 1 to 13 are cross-sectional views of a flexible display apparatus according to a first embodiment of the present invention.

Hereinafter, the present invention will be described more fully with reference to the accompanying drawings, in which exemplary embodiments of the invention are shown. As used herein, the term "and/or" includes any and all combinations of one or more of the associated listed items. Expressions such as "at least one of," when preceding a list of elements, modify the entire list of elements and do not necessarily modify the individual elements of the list.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure aspects of the invention.

While such terms as "first," "second," etc., may be used to describe various components, such components should not be limited to the above terms. The above terms are used to distinguish one component from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

In the accompanying drawings, thicknesses and sizes of layers or regions may be exaggerated for clarity. It will be understood that when a portion such as a layer, membrane, region, and plate, is referred to as being "on" another portion, it can be directly on the other portion, or sometimes, intervening portions may also be present therebetween.

Hereinafter, exemplary embodiments of the present invention will be described in detail with reference to the accompanying drawings.

FIGS. 1 to 13 are cross-sectional views of a flexible display apparatus according to an embodiment of the present invention to schematically describe a method of fabricating an organic light-emitting display apparatus.

First, a flexible substrate 111 is formed on a support substrate 101.

The support substrate 101 is separated from the flexible substrate 111 by laser beam irradiation, chemical dissolution, or the like which will be performed in a separation process. The support substrate 101 may be a glass substrate. However, the present invention is not limited thereto. The support substrate 101 may also be, besides the glass substrate, selected from various substrates such as a transparent plastic or metallic substrate capable of supporting the flexible substrate 111 and enduring processing stress during a process of forming a device and a wiring on the flexible substrate 111.

The flexible substrate 111 may have good heat resistance and durability, may be applied to a curved surface, and may be formed of a plastic material with good heat resistance and durability, such as polyethylene ether phthalate, polyethylene naphthalate, polycarbonate, polyarylate, polyetherimide, polyethersulfone, or polyimide. However, the present invention is not limited thereto, and various other flexible materials may also be used.

Although not shown in FIG. 1, a separation layer (not shown) may be formed between the support substrate 101 and the flexible substrate 111. The separation layer may be formed of various materials, preferably, a material suitable for a separation process.

Figure 2:
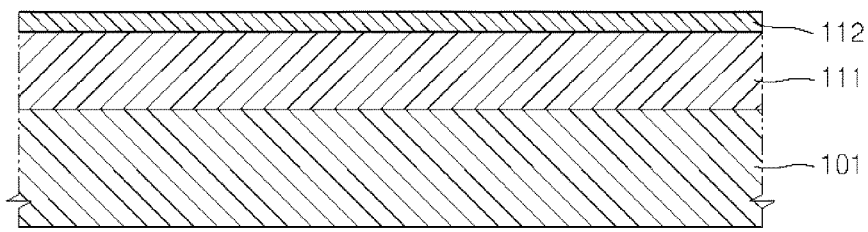

Then, as shown in FIG. 2, a buffer layer 112 may be formed on the flexible substrate 111. The buffer layer 112 may include at least one of an inorganic layer or an organic layer. The buffer layer 112 plays a role in blocking diffusion of moisture and impurities generated in the flexible substrate 111 and controlling heat transmission during the crystallization of a semiconductor, resulting in assisting crystallization of the semiconductor.

Figure 3:
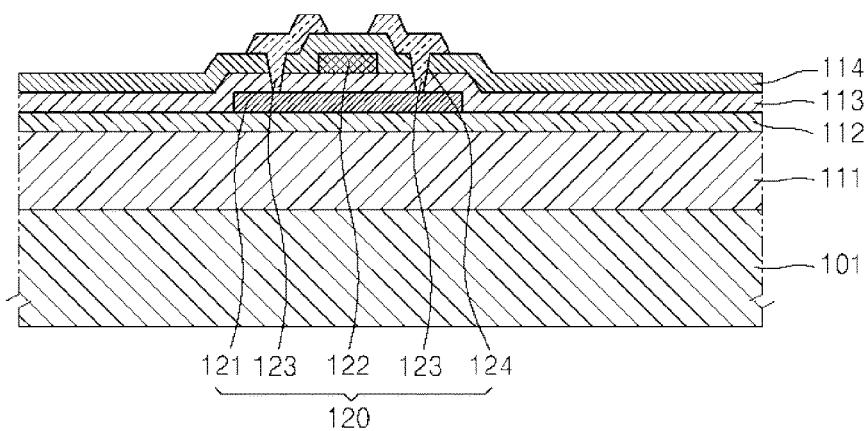

Referring to FIG. 3, a thin film transistor (TFT) 120 is formed on the buffer layer 112. In FIG. 3, a top gate type TFT is illustrated. However, the TFT may be any type of TFT such as a bottom gate type TFT. Hereinafter, the TFT having the structure shown in FIG. 3 will be described.

To form a top gate type transistor, a semiconductor layer 121, a gate insulating layer 113, a gate electrode 122, an interlayer insulating layer 114, a contact hole 124, and source and drain electrodes 123 are sequentially formed on the buffer layer 112.

The semiconductor layer 121 may be formed of polysilicon. In this case, a predetermined region of the semiconductor layer 121 may be doped with impurities. The semiconductor layer 121 may be formed of amorphous silicon instead of polysilicon, and may also be formed of various organic semiconductor materials such as pentacene.

When the semiconductor layer 121 is formed of polysilicon, amorphous silicon is formed and crystallized into polysilicon. In order to crystallize amorphous silicon, rapid thermal annealing (RTA), solid phase crystallization (SPC), excimer laser annealing (ELA), metal-induced crystallization (MIC), metal-induced lateral crystallization (MILC), or sequential lateral solidification (SLS) may be used. In order to use the plastic substrate according to the current embodiment, a method not including a high temperature heating operation may be desirable.

The gate insulating layer 113 is formed between the semiconductor layer 121 and the gate electrode 122 to insulate the gate electrode 122 from the semiconductor layer 121. The gate insulating layer 113 may be formed of an insulating material such as silicon oxide or silicon nitride. The gate insulating layer 113 may also be formed of another insulating organic material.

The gate electrode 122 may be formed of a variety of conductive materials. For example, the gate electrode 122 may be formed of a material such as Mg, Al, Ni, Cr, Mo, W, MoW, or Au. In this regard, the gate electrode 122 may have various structures, for example, a single-layered structure or a multi-layered structure.

The interlayer insulating layer 114 may be formed of an insulating material such as silicon oxide or silicon nitride. The interlayer insulating layer 114 may also be formed of another insulating organic material. Portions of the interlayer insulating layer 114 and the gate insulating layer 113 may be selectively removed to form contact holes 124 exposing source and drain regions of the semiconductor layer 121. In addition, source and drain electrodes 123 that have a single-layered or multi-layered structure are formed on the interlayer insulating layer 114 using the material used to form the gate electrode 122 (e.g., using a material suitable for forming the gate electrode 122) so as to fill the contact holes 124.

Figure 4:
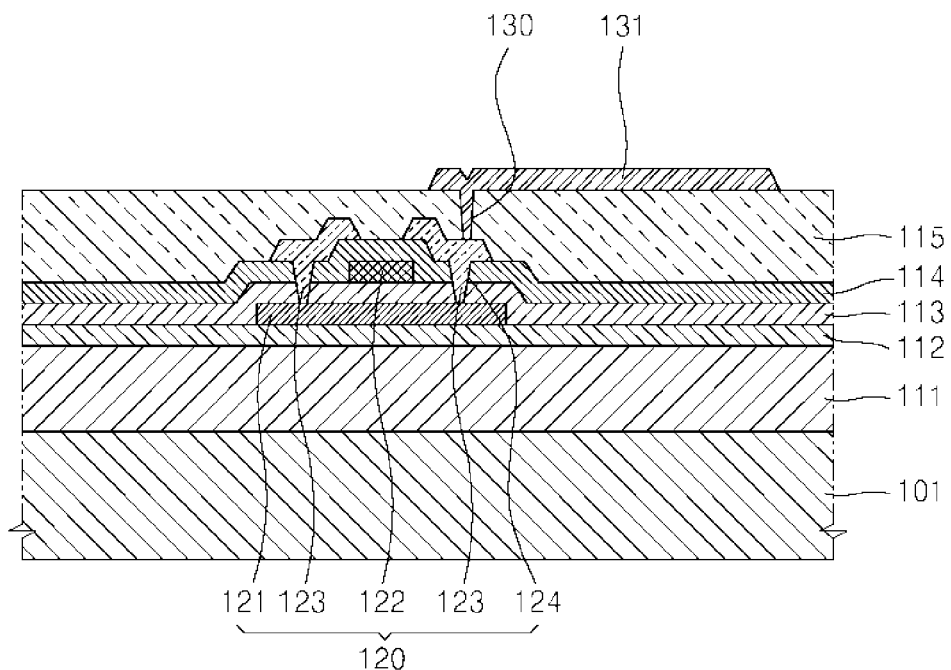

Referring to FIG. 4, a planarization layer 115 (protective layer and/or passivation layer) is formed on the source and drain electrodes 123 so as to protect and planarize the TFT disposed below the planarization layer 115. The planarization layer 115 may have various shapes and may be formed of an organic material such as benzocyclobutene (BCB) or acryl or an inorganic material such as SiNx. The planarization layer 115 may also have a single-layered, double-layered, or multi-layered structure, and a variety of modifications may be possible.

Then, an emissive device is formed on the TFT. Although an organic light-emitting diode (OLED) is used herein as the display device, the present invention is not limited thereto, and various display devices may also be used.

In order to form the OLED on the TFT, a first electrode 131 is formed on the planarization layer 115 and is electrically connected to one of the source and drain electrodes 123 via a contact hole 130 formed in the planarization layer 115. The first electrode 131 may function as an anode or a cathode and may be formed of various conductive materials.

The first electrode 131 may be a transparent electrode or a reflective electrode according to emission type. The transparent electrode may be formed using ITO, IZO, ZnO, or $In_2O_3$, and the reflective electrode may be formed by forming a reflective layer using Ag, Mg, Al, Pt, Pd, Au, Ni, Nd, Ir, Cr, or any combination thereof and forming ITO, IZO, ZnO, or $In_2O_3$ on the reflective layer.

Figure 5:
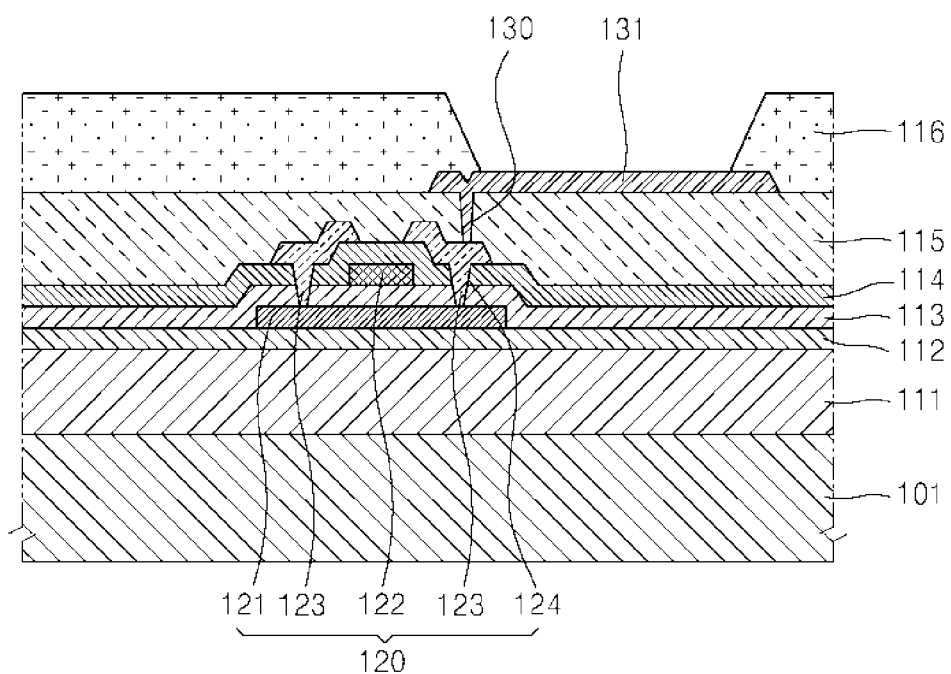

Then, referring to FIG. 5, a pixel-defining layer 116 that is patterned using an insulating material is formed on the first electrode 131 so as to expose at least a portion of the first electrode 131. The pixel-defining layer 116 may be an inorganic layer formed of an inorganic material selected from silicon oxide ($SiO_2$), a silicon nitride ($SiN_x$), or the like.

Figure 6:
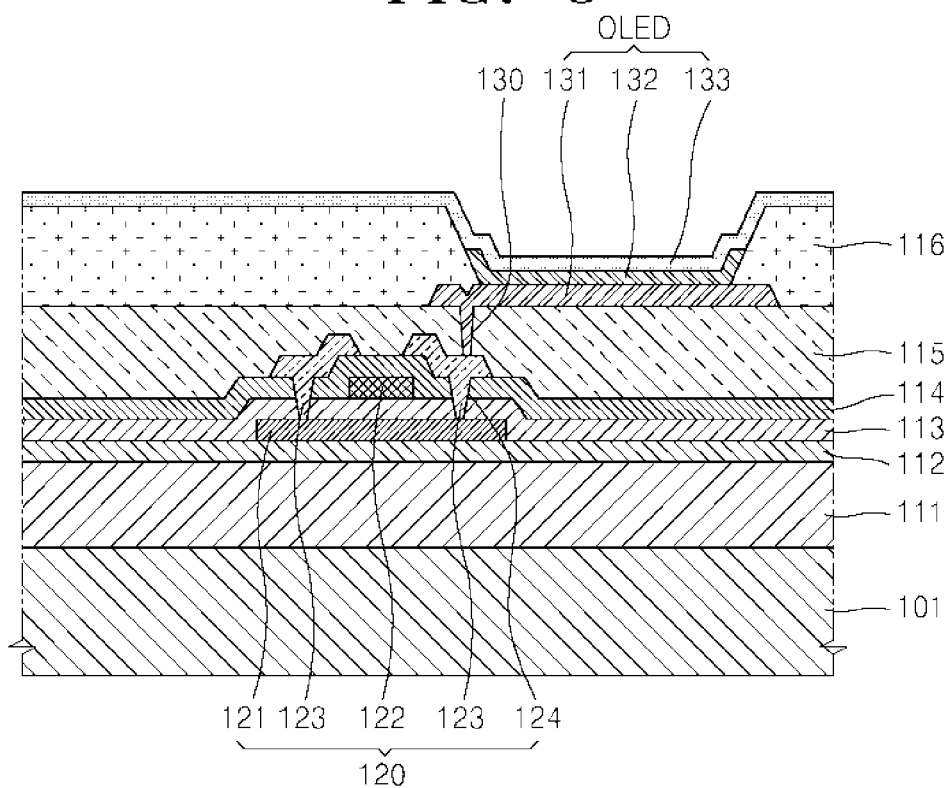

Referring to FIG. 6, an intermediate layer 132, including an emissive layer (EML), is formed on the exposed portion of first electrode 131 through the opening of the pixel-defining layer 116, and a second electrode 133 is formed on the intermediate layer 132 to be opposite to the first electrode 131, so as to prepare the OLED. The intermediate layer 132 includes at least the EML and may further include at least one layer selected from a hole injection layer (HIL), a hole transport layer (HTL), an electron transport layer (ETL), or an electron injection layer (EIL).

Referring to FIG. 6, the intermediate layer 132 is patterned to correspond to each sub-pixel, i.e., the patterned first electrode 131. However, for convenience of description, FIG. 6 shows one sub-pixel, and, according to another embodiment, the intermediate layer 132 may also be formed integrally with the intermediate layer 132 of an adjacent sub-pixel. The intermediate layer 132 may be modified in various forms. For example, the intermediate layer 132 may include a plurality of layers, wherein one layer thereof may be formed to correspond to each sub-pixel and the other layers may be formed integrally with the intermediate layer 132 of an adjacent sub-pixel.

If the OLED is a full-color OLED, the EML may be patterned into a red EML, a green EML, and a blue EML according to the red sub-pixel, the green sub-pixel, and the blue sub-pixel. In addition, the EML may have a multi-layered structure in which a red EML, a green EML, and a blue EML are stacked or a single-layered structure including a red emitting material, a green emitting material, and a blue emitting material so as to emit white light.

The second electrode 133 may be a cathode or an anode according to the functions of the first electrode 131. The second electrode 133 may also be a transparent electrode or a reflective electrode, as the first electrode 131. The transparent electrode may include a layer including Li, Ca, LiF/Ca, LiF/Al, Al, Mg, or any compound thereof, and an auxiliary electrode or bus electrode line may be formed on the layer, and the auxiliary electrode may be formed of a material used to form a transparent electrode, such as ITO, IZO, ZnO, or $In_2O_3$. In addition, the reflective electrode is formed by blanket depositing Li, Ca, LiF/Ca, LiF/Al, Al, Mg, or any compound thereof.

Figure 7:
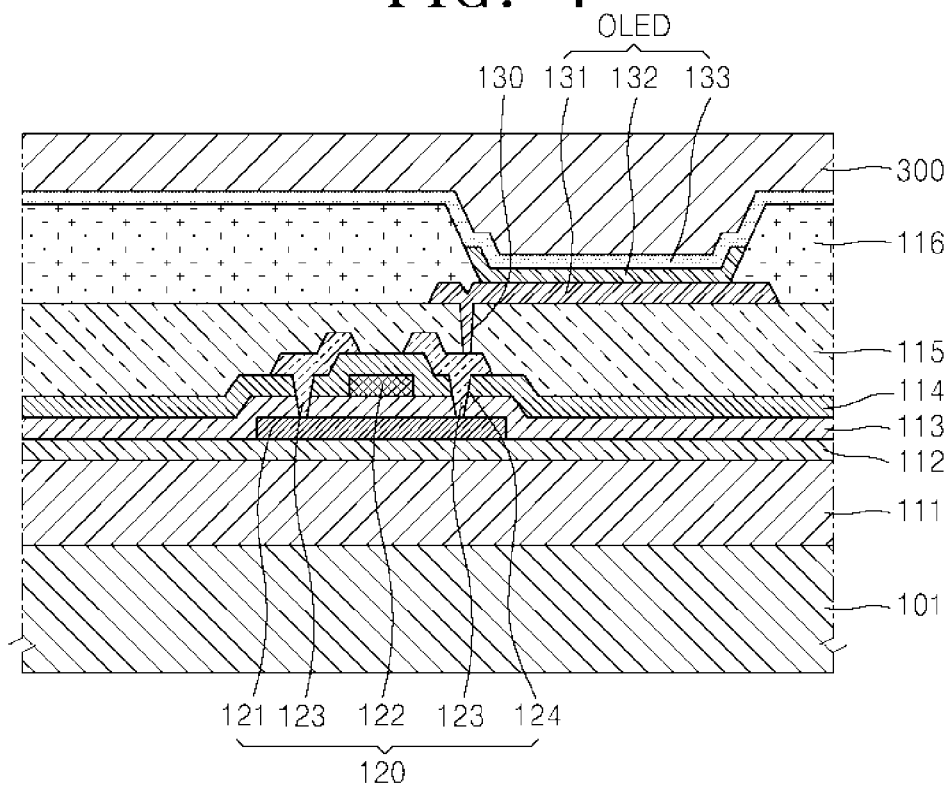
Figure 8:
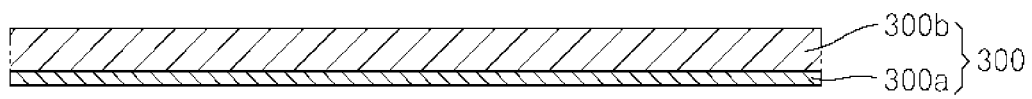

Referring to FIG. 7, a first encapsulation layer 300 is formed on the second electrode 133 to encapsulate the OLED. The first encapsulation layer 300 may be a first barrier layer of an inorganic material, organic material, or organic-inorganic composite laminate. When the first encapsulation layer 300 is a multi-layered thin film encapsulation layer in which an inorganic material 300a and an organic material 300b are alternately stacked as shown in FIG. 8, the inorganic layer 300a may protect against and block moisture, and the organic layer 300b may planarize and fill defects in the structure. The organic layer 300b may be an organic insulating layer that includes one or more commercially available polymers, e.g., polymethyl methacrylate (PMMA) or polystyrene (PS), a phenol group-based polymer derivative, an acryl-based polymer, an imide-based polymer, an aryl ether-based polymer, an amide-based polymer, a fluorinated polymer, a p-xylene-based polymer, a vinyl alcohol-based polymer, or any combination thereof. The inorganic layer 300a may be an inorganic insulating layer that includes $SiO_2$, $SiN_x$, SiON, $Al_2O_3$, $TiO_2$, $Ta_2O_5$, $HfO_2$, $ZrO_2$, BST, PZT, or the like. The first encapsulation layer 300 having a multi-layered thin-film structure may be formed in a thin layer, and may be, for example, a 1.5 dyad film. A 1 dyad film includes one inorganic layer and one organic layer, thus, a 1.5 dyad film includes one inorganic layer, one organic layer, and then an additional inorganic layer or organic layer. The stacking order of the inorganic layer 300a and the organic layer 300b may be modified. Although the first encapsulation layer 300 of FIG. 8 has a complex structure including one inorganic layer 300a and one organic layer 300b, the present invention is not limited thereto. The first encapsulation layer 300 may also have a complex structure including one or more inorganic layers 300a and one or more organic layers 300b.

Figure 9:
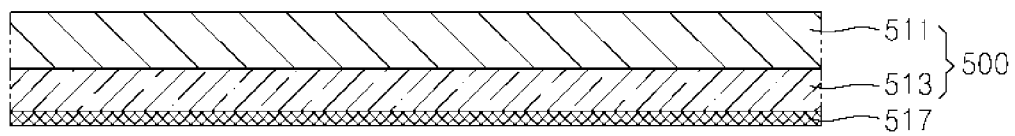

Then, a second encapsulation layer 500 is separately prepared as shown in FIG. 9.

In a general organic light-emitting display device, an integrated polarizing film including a polarizing plate and a quarter wave plate is formed on the OLED in order to block a reflection of external light. In addition, the OLED includes organic materials and a metallic cathode including Ag, such as Mg:Ag. Properties of the organic materials may deteriorate or the cathode may be oxidized by moisture or oxygen, resulting in pixel defects, and the like. In order to prevent or reduce the defects, an encapsulation technique using glass may be used, or a thin film encapsulation (TFE) technique using an organic layer and an inorganic layer alternately disposed may be used to form a flexible display. In both cases, a water vapor transmission rate (WVTR) required to protect the OLED layer from oxygen or moisture may be $10^{-6}$ g/m$^2$/day or less.

As a plurality of panels are formed on a single substrate in the manufacture of display devices, a separation process for separating a substrate from a plastic film after the encapsulation process and a cutting process for separating each panel from each other needs to be performed.

When a thin film encapsulation technique is applied, a separate temporary protective film is adhered onto the thin film encapsulation layer after the encapsulation process and before the integrated polarizing film is adhered onto the OLED, and then subsequent processes such as the separation and cutting processes are conducted, to protect the lower thin film encapsulation layer from damage which may occur in the subsequent processes. Then, the temporary protective film is removed, and the integrated polarizing film is attached thereto.

However, while removing the temporary protective film, defects such as tearing of the lower thin film encapsulation layer may occur, and manufacturing costs may increase due to processes such as adhering and removing of the temporary protective film. In addition, if a multi-layered organic-inorganic complex layer is formed on the OLED in order to prevent or reduce infiltration of external moisture, there are many limitations in the organic material and a process to remove damage of the lower devices. For example, the organic layer needs to be sufficiently thick to cover the lower devices. However, it needs to be deposited as a monomer, and thus a processing difficulty may arise. In addition, a large amount of outgas is generated while depositing an inorganic layer due to plasma damage, or the like, thereby causing pixel defects.

According to the current embodiment, in order to overcome these problems, the thickness of the first encapsulation layer 300 is decreased to be less than that of the existing encapsulation thin film, and the substrate is separated after the second encapsulation layer 500 is adhered on the first encapsulation layer 300 on the OLED before the separation and cutting processes. Thus, the encapsulation process of the OLED may be efficiently conducted in a cost-effective manner.

Figure 10:
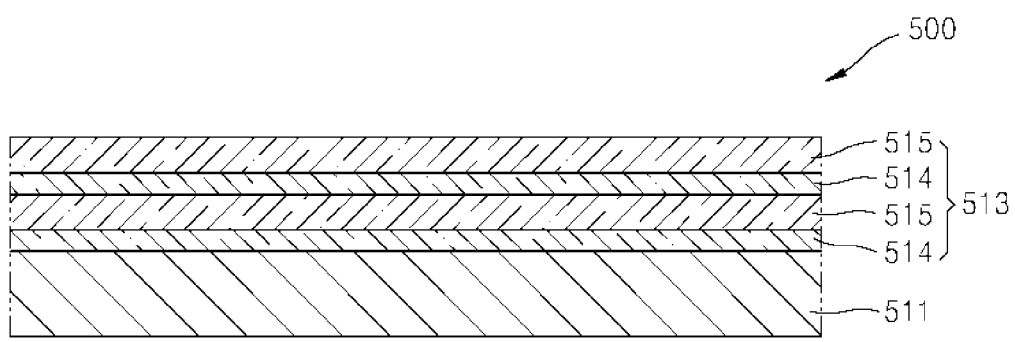

In order to form the second encapsulation layer 500, a second barrier layer 513 is formed on a base film 511. The base film 511 is a quarter wave ($\lambda$/4) film that changes linearly polarized light to circularly polarized light, or vice versa, by providing $\lambda$/4 phase difference to two polarization components perpendicular to each other. The second barrier layer 513 may have a multi-layered structure including at least one inorganic layer or an inorganic layer 514 and an organic layer 515 which are alternately stacked as shown in FIG. 10 in a similar manner to the first barrier layer of the first encapsulation layer 300. Herein, the inorganic layer 514 may protect against and block moisture, and the organic layer 515 may perform planarization and defect filling. The organic layer 515 may be an organic insulating layer including an acryl, a polyimide, or the like. The inorganic layer 514 may be an inorganic insulating layer that includes $SiO_2$, $SiN_x$, SiON, $Al_2O_3$, $TiO_2$, $Ta_2O_5$, $HfO_2$, $ZrO_2$, BST, PZT, or the like. The stacking order of the inorganic layer 514 and the organic layer 515 may be changed. Although the second barrier layer 513 of FIG. 10 has a complex structure including two inorganic layers 514 and two organic layers 515, the present invention is not limited thereto. The second barrier layer 513 may also have a complex structure including one or more inorganic layers 514 and one or more organic layers 515.

An adhesive layer 517 is formed on the second barrier layer 513. The adhesive layer 517 may be formed of an adhesive or glue formed of a material that does not alter the optical characteristics of components and does not need to be processed at a high temperature while being cured or dried. For example, an acrylic polymer, a silicon polymer, a polyester, a polyurethane, a polyether, or a synthetic rubber may be used.

Figure 11:
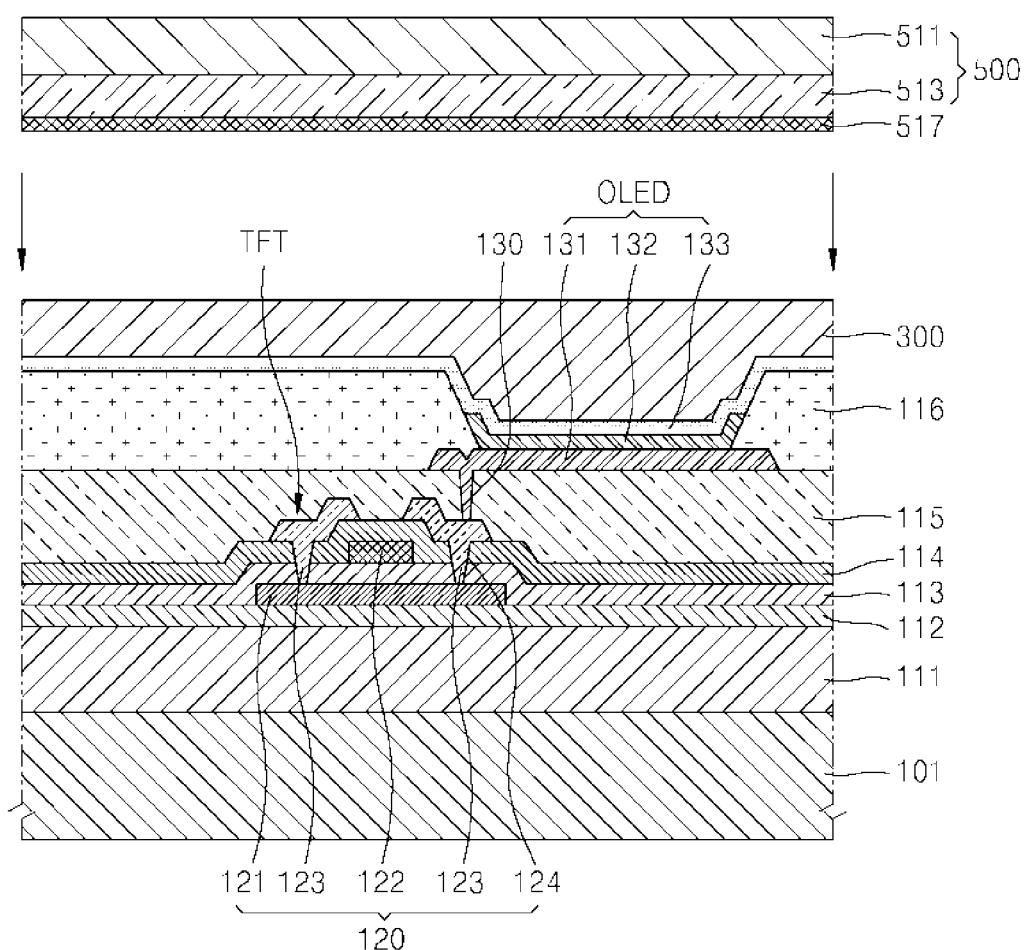

Referring to FIG. 11, the second encapsulation layer 500 is disposed on the first encapsulation layer 300 and bonded thereto using the adhesive layer 517 by pressurizing the structure (e.g., by applying pressure to the structure).

By bonding the first encapsulation layer 300 and the second encapsulation layer 500, the total thickness of the first barrier layer and the second barrier layer 513 may be similar to that of the encapsulation thin film directly formed on the existing OLED. Upon comparing with existing encapsulation methods of directly forming a multi-layered organic-inorganic complex layer on the OLED, according to the encapsulation technique of the current embodiment, the second encapsulation layer 500 is separately formed from the first encapsulation layer 300 and assembled with the first encapsulation layer 300, so that the thickness of the organic layer and the outgas of the inorganic layer may be easily controlled, and infiltration of external moisture may be prevented.

Figure 12:
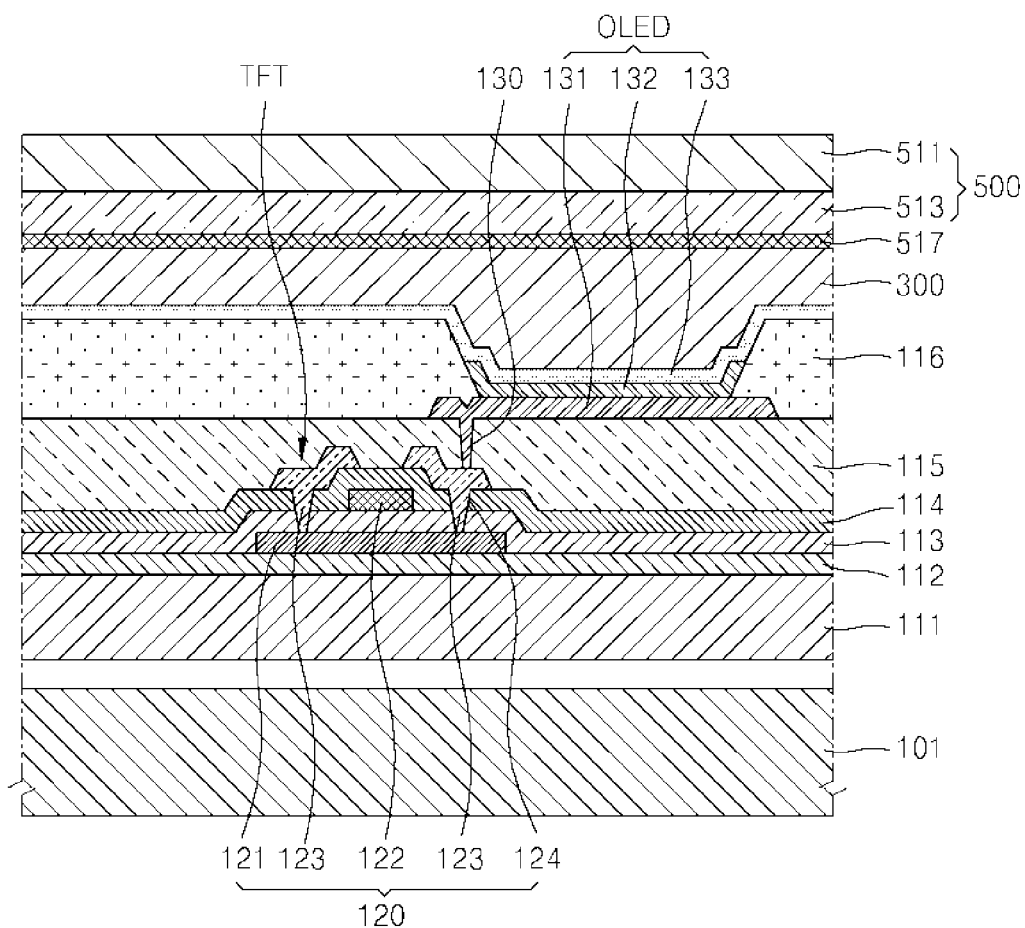

Then, as shown in FIG. 12, a delamination process for separating the support substrate 101 from the flexible substrate 111 is performed. The support substrate 101 is separated from the flexible substrate 111 by laser beam irradiation or chemical dissolution. The laser beam may be a coherent light having a wavelength in a range of 100 nm to 350 nm, and may be, for example, XeCl, KrF, or ArF obtained by combining AF, Kr, Xe, or the like with halogen gas, e.g., $F_2$, HCl, or the like.

Then, a cutting process of the panel is conducted.

Figure 13:
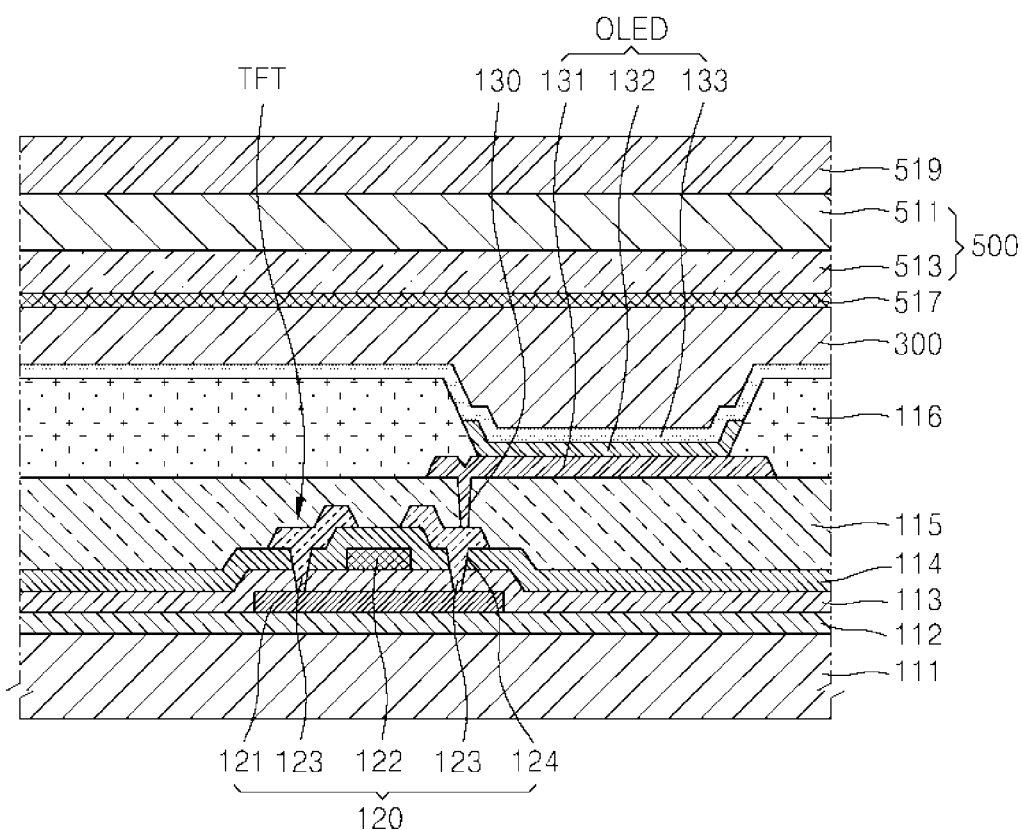

Finally, as shown in FIG. 13, a polarizing plate 519 is formed on the second encapsulation layer 500. The polarizing plate 519 may be a linear polarizing plate or linear polarizing film with a single- or multi-layered structure. By using the base film 511 that is a $\lambda$/4 film and the polarizing plate 519, the organic light-emitting display device may inhibit the reflection of external light.

Figure 14:
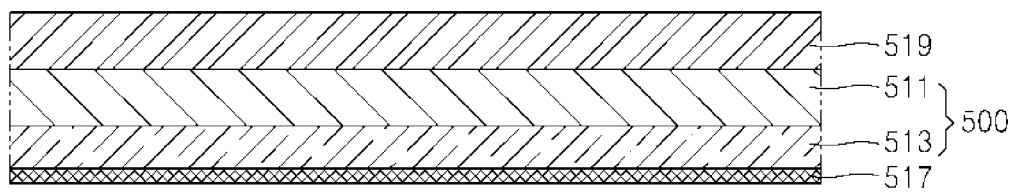
FIGS. 14 to 16 are cross-sectional views of a flexible display apparatus according to a second embodiment of the present invention.
Figure 15:
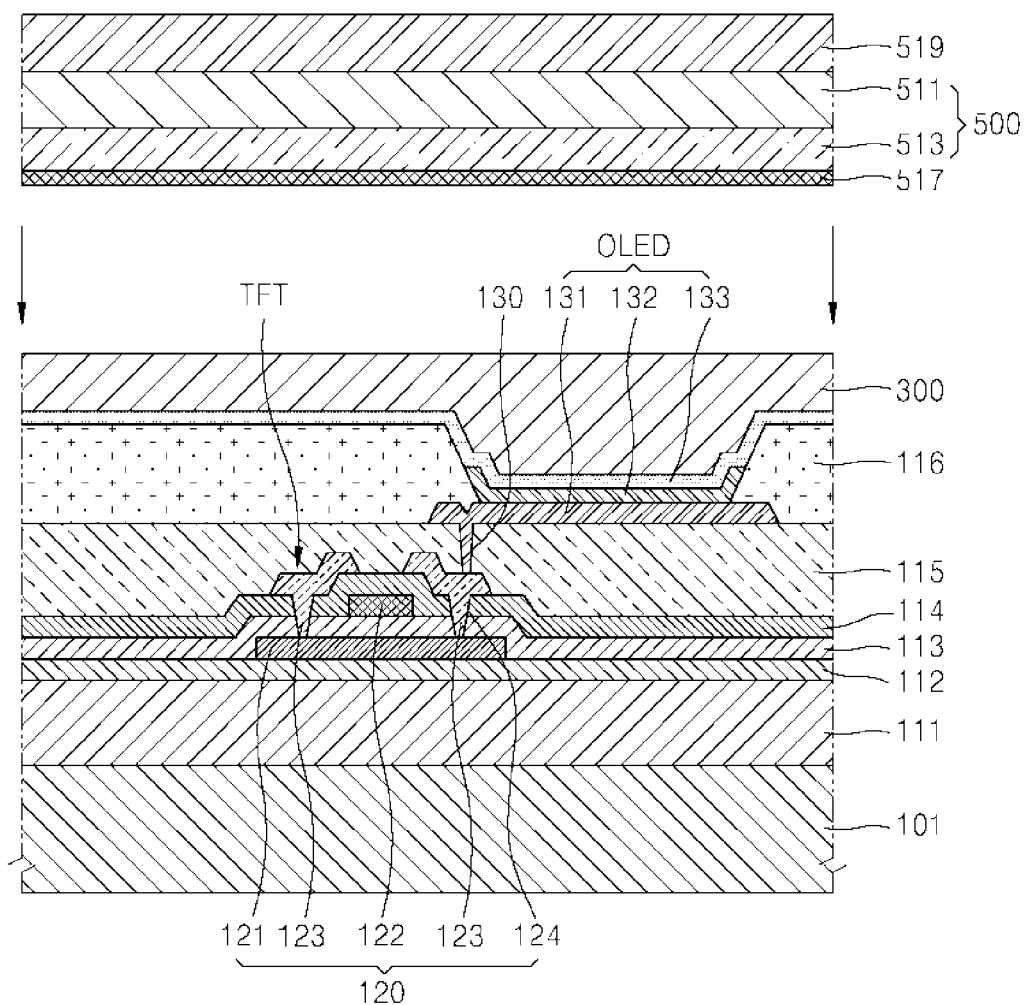
Figure 16:
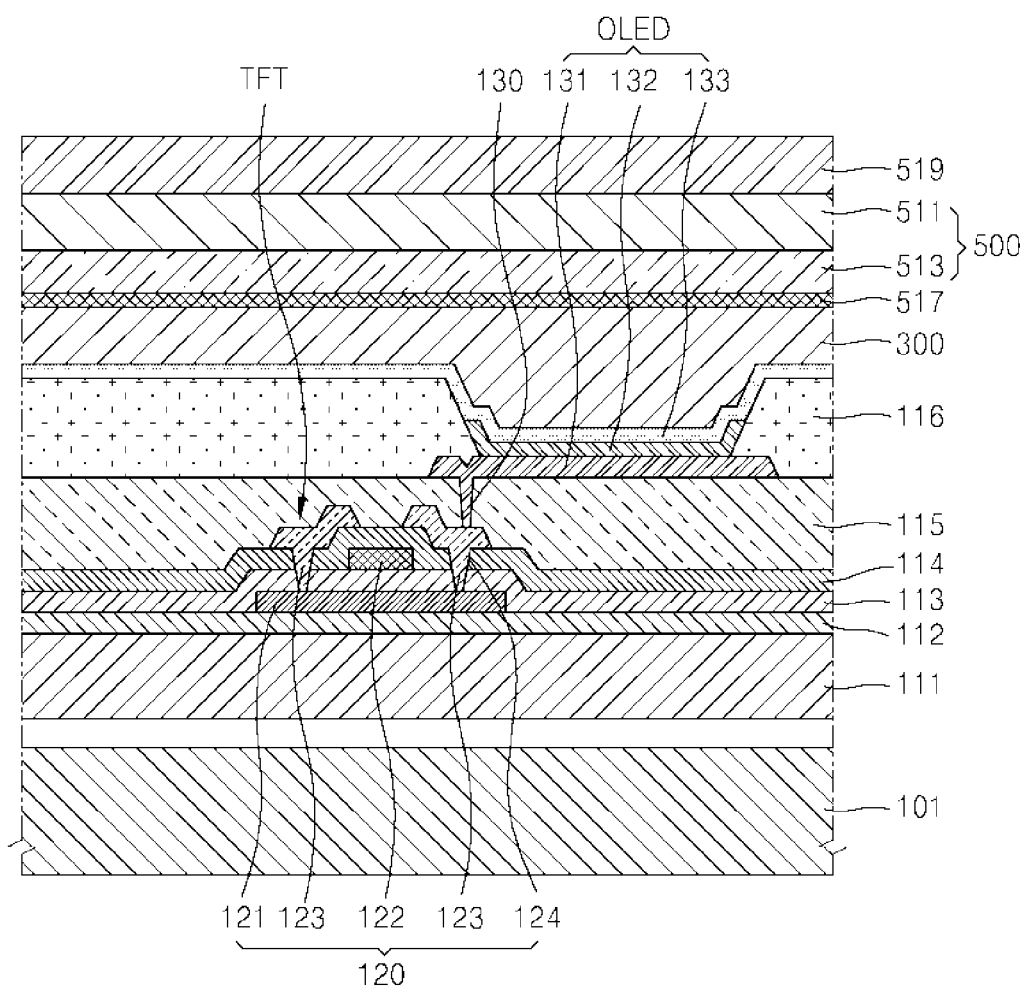

FIGS. 14 to 16 are cross-sectional views of a flexible display apparatus according to another embodiment of the present invention to schematically describe a method of fabricating an organic light emitting display apparatus. The organic light-emitting display apparatus according to this embodiment is different from the first embodiment in that the polarizing plate is disposed on an integrated second encapsulation layer 500 including a $\lambda$/4 plate and organic and inorganic thin films, and the second encapsulation layer 500 is adhered to the OLED. Thus, hereinafter, the descriptions provided above with reference to FIGS. 1 to 13 may not be repeated.

A TFT 120, an OLED, and a first encapsulation layer 300 are formed on the flexible substrate 111 formed on the support substrate 101 in the same manner as described with reference to FIGS. 1 to 8.

Then, a second encapsulation layer 500 is separately prepared as shown in FIG. 14, and a polarizing plate 519 is disposed on the second encapsulation layer 500.

In order to form the second encapsulation layer 500, a second barrier layer 513 is formed on one surface of a base film 511. An adhesive layer 517 is formed on the second barrier layer 513.

The polarizing plate 519 is disposed on the opposite surface of the base film 511. The polarizing plate 519 may be a linear polarizing plate or linear polarizing film with a single- or multi-layered structure. By using the base film 511 that is a $\lambda/4$ film and the polarizing plate 519, the organic light-emitting display device may inhibit the reflection of external light.

Referring to FIG. 15, the second encapsulation layer 500 having the polarizing plate 519 thereon is disposed on the first encapsulation layer 300 and bonded thereto using the adhesive layer 517 by pressurizing the structure (e.g., by applying pressure to the structure).

Then, as shown in FIG. 16, a delamination process for separating the support substrate 101 from the flexible substrate 111 is performed. Then, a cutting process of the panel is conducted.

Figure 17:
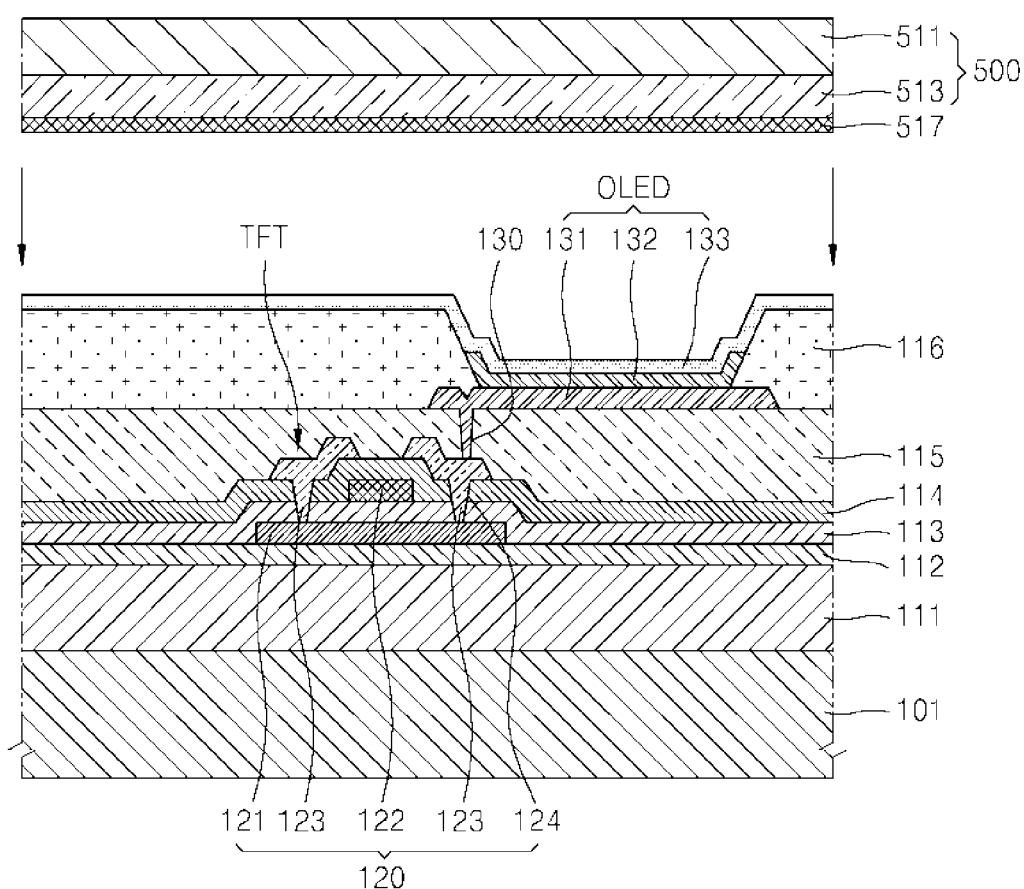
FIGS. 17 to 19 are cross-sectional views of a flexible display apparatus according to a third embodiment of the present invention.
Figure 18:
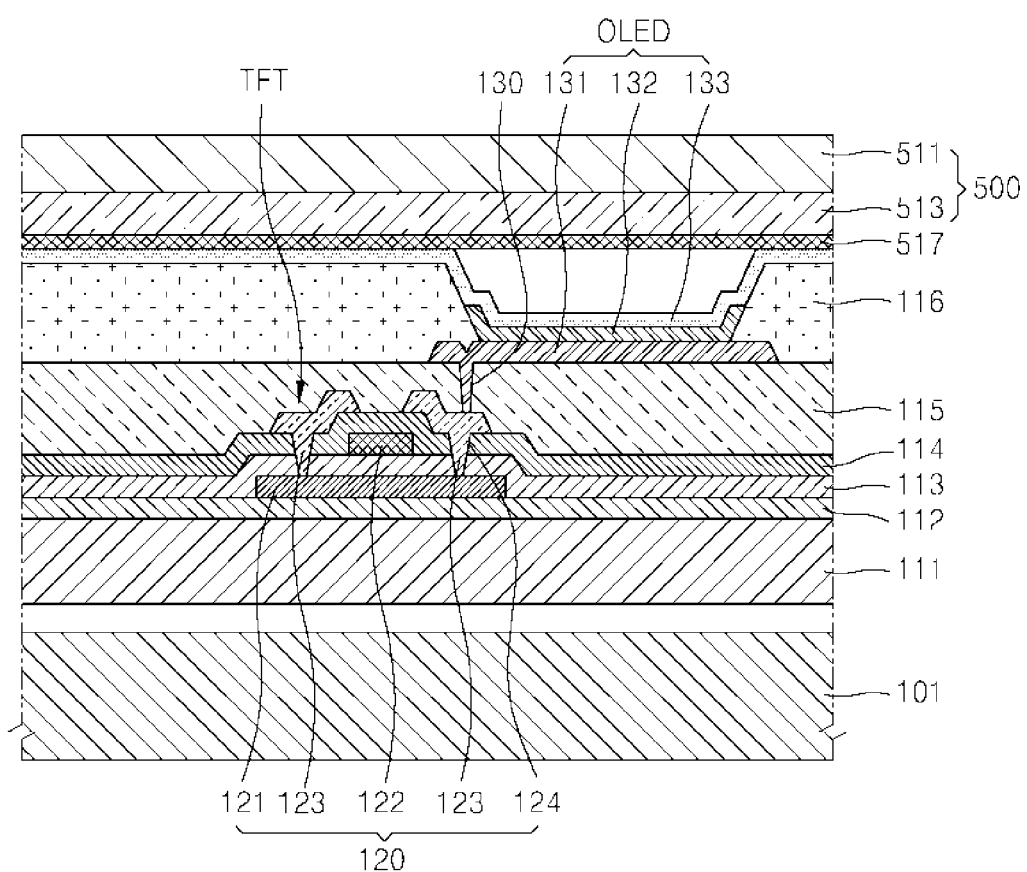
Figure 19:
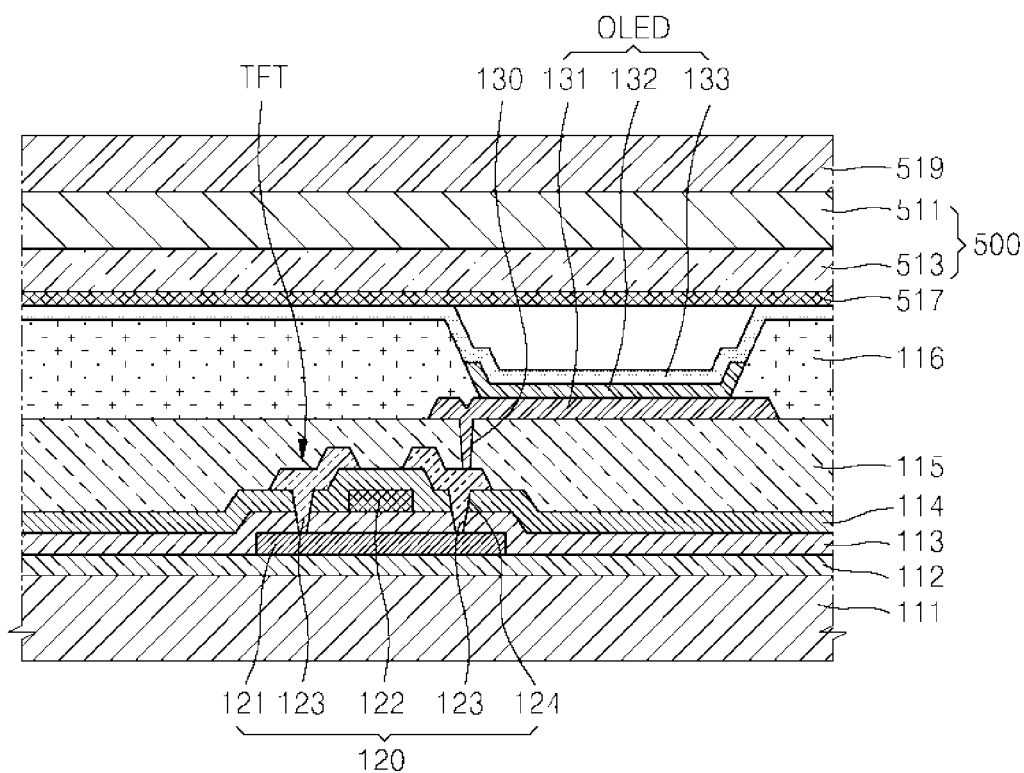

FIGS. 17 to 19 are cross-sectional views of a flexible display apparatus according to another embodiment of the present invention to schematically describe a method of fabricating an organic light-emitting display apparatus. The organic light-emitting display device according to this embodiment is different from the first embodiment in that an organic-inorganic thin film layer is not formed on a lower substrate and an integrated second encapsulation layer 500 including a $\lambda/4$ plate and organic and inorganic thin films are directly attached to the OLED. Thus, hereinafter, the descriptions provided above with reference to FIGS. 1 to 13 may not be repeated.

A TFT 120 and an OLED are formed on the flexible substrate 111 formed on the support substrate 101 in the same manner as described with reference to FIGS. 1 to 6.

Then, as shown in FIG. 9, a second encapsulation layer 500 is separately formed. In order to form the second encapsulation layer 500, a second barrier layer 513 is formed on a base film 511. An adhesive layer 517 is formed on the second barrier layer 513.

Then, the second encapsulation layer 500 is bonded to the OLED by the adhesive layer 517, as shown in FIG. 17.

Then, as shown in FIG. 18, a delamination process for separating the support substrate 101 from the flexible substrate 111 is performed. Then, a cutting process of the panel is conducted.

Then, a polarizing plate 519 is adhered to the second encapsulation layer 500, as shown in FIG. 19. The polarizing plate 519 may be a linear polarizing plate or linear polarizing film with a single- or multi-layered structure. By using the base film 511 that is a $\lambda/4$ film and the polarizing plate 519, the organic light-emitting display device may inhibit the reflection of external light to improve contrast.

In the organic light-emitting display apparatus according to one or more embodiments of the present invention, the OLED may be protected from external oxygen or moisture and damage occurring by attachment and detachment of a temporary protective film by separating the $\lambda/4$ plate from the polarizing plate and adhering an integrated encapsulation member including the $\lambda/4$ plate and an organic-inorganic thin film to the OLED. Furthermore, by respectively forming the organic-inorganic thin film on the OLED and the separate encapsulation layer, processing limitations that may be caused when a multi-layered organic-inorganic complex layer is formed may be eliminated.

As described above, according to the method of fabricating a flexible display apparatus, according to one or more of the above embodiments of the present invention, there is provided an encapsulation method by which internal outgas may be controlled and infiltration of external moisture is inhibited in a cost-effective manner, so that the fabricating may be easily performed and damage to an organic light-emitting diode may be inhibited.

While the present invention has been particularly shown and described with reference to exemplary embodiments thereof, it will be understood by those of ordinary skill in the art that various changes in form and details may be made therein without departing from the spirit and scope of the present invention as defined by the following claims and equivalents thereof.

What is claimed is:

1. A method of manufacturing a flexible display apparatus comprising:
   preparing a flexible film on which a light-emitting diode and a first barrier layer are sequentially formed;
   separately preparing a polarizing film on which a second barrier layer and an adhesive layer are sequentially formed, the second barrier layer being between the polarizing film and the adhesive layer, wherein a first surface of the adhesive layer directly contacts the second barrier layer; and
   attaching the flexible film and the polarizing film such that a second surface of the adhesive layer opposite the first surface of the adhesive layer contacts the first barrier layer,
   wherein preparing the polarizing film comprises attaching a quarter wave plate to a polarizing plate of the polarizing film, the quarter wave plate being between the polarizing plate of the polarizing film and the second barrier layer.

2. The method of claim 1, further comprising forming the first barrier layer over the flexible film by forming a multi-layer barrier layer comprising an inorganic layer and an organic layer.

3. The method of claim 1, further comprising forming the second barrier layer over the polarizing film by forming a multi-layer barrier layer comprising an inorganic layer and an organic layer.

4. The method of claim 1, wherein the preparing of the flexible film comprises separating a support substrate on which the flexible film is formed.

5. The method of claim 1, wherein the polarizing film comprises a linear polarizer.

6. A method of manufacturing a flexible display apparatus comprising:
   sequentially forming a light-emitting diode and a first barrier layer on a flexible film;
   sequentially forming a second barrier layer and an adhesive layer on a polarizing film separate from the flexible film, the second barrier layer being between the polarizing film and the adhesive layer, wherein a first surface of the adhesive layer directly contacts the second barrier layer;

attaching the flexible film and the polarizing film to each other such that a second surface of the adhesive layer opposite the first surface of the adhesive layer contacts the first barrier layer; and attaching a quarter wave plate to the polarizing film, the quarter wave plate being between the polarizing film and the second barrier layer.

7. The method of claim 6, wherein the first barrier layer comprises a first multi-layer barrier layer comprising an inorganic layer and an organic layer.

8. The method of claim 7, wherein the second barrier layer comprises a second multi-layer barrier layer comprising an inorganic layer and an organic layer.

9. The method of claim 6, further comprising separating a support substrate from the flexible film.

10. The method of claim 6, wherein the polarizing film comprises a linear polarizer.

\* \* \* \* \*